US010156761B2

United States Patent
Irzyk et al.

(10) Patent No.: US 10,156,761 B2
(45) Date of Patent: Dec. 18, 2018

(54) DEVICE AND METHOD FOR EMITTING A LIGHT BEAM INTENDED TO FORM AN IMAGE, PROJECTION SYSTEM, AND DISPLAY USING SAID DEVICE

(71) Applicant: Valeo Études Électroniques, Créteil (FR)

(72) Inventors: Michael Irzyk, Créteil (FR); Frédéric Autran, Créteil (FR)

(73) Assignee: Valeo Etudes Electroniques, Creteil (FR)

( * ) Notice: Subject to any disclaimer, the term of this patent is extended or adjusted under 35 U.S.C. 154(b) by 248 days.

(21) Appl. No.: 14/414,947

(22) PCT Filed: Jul. 16, 2013

(86) PCT No.: PCT/FR2013/000186
§ 371 (c)(1),
(2) Date: Jan. 15, 2015

(87) PCT Pub. No.: WO2014/013143
PCT Pub. Date: Jan. 23, 2014

(65) Prior Publication Data
US 2015/0168795 A1      Jun. 18, 2015

(30) Foreign Application Priority Data

Jul. 18, 2012    (FR) .................................... 12 56957

(51) Int. Cl.
*G02B 27/01*      (2006.01)
*G02F 1/15*       (2006.01)
(Continued)

(52) U.S. Cl.
CPC .............. *G02F 1/15* (2013.01); *G02B 27/01* (2013.01); *G02B 27/0101* (2013.01);
(Continued)

(58) Field of Classification Search
CPC ..... G02F 2001/1512; G02F 2001/1515; G02B 2027/0112; G02B 2027/0114;
(Continued)

(56) References Cited

U.S. PATENT DOCUMENTS

| 5,057,861 A * | 10/1991 | Maeda .................. G03B 27/32 |
| | | 355/100 |
| 5,119,390 A * | 6/1992 | Ohmori ..................... H01S 3/10 |
| | | 355/53 |
| 6,574,030 B1 | 6/2003 | Mosier |

(Continued)

FOREIGN PATENT DOCUMENTS

| DE | 10 2008 054 443 A1 | 7/2009 |
| FR | 2 933 784 A1 | 1/2010 |

OTHER PUBLICATIONS

International Search Report for corresponding International Application No. PCT/FR2013/000186, dated Sep. 27, 2013 (6 pages).

*Primary Examiner* — Sultan Chowdhury
(74) *Attorney, Agent, or Firm* — Osha Liang LLP

(57) ABSTRACT

A device for emitting a light beam intended to form an image including one or more sources, each emitting a beam of the laser type, and an attenuation means situated downstream of the source or sources that allows the varying of the optical power of the light beam by transmitting or reflecting the beam or beams as a function of a supply current of the attenuation means. The device forms the light beam from the one laser beam or from the bringing together of the laser beams by combination.

13 Claims, 2 Drawing Sheets

Figure 1:
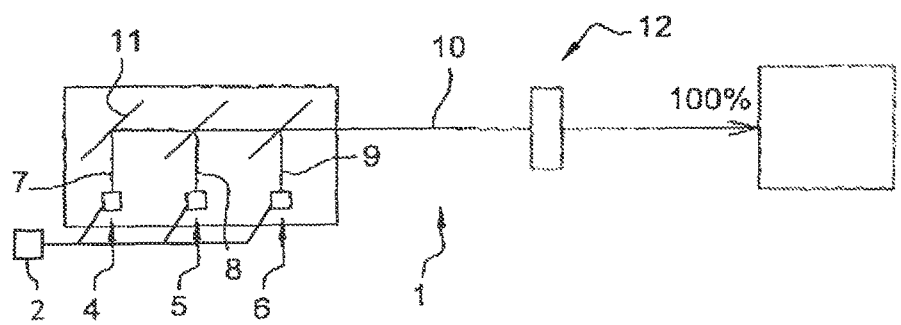

(51) Int. Cl.
*H04N 9/31* (2006.01)
*G03B 21/20* (2006.01)
*H01S 5/00* (2006.01)

(52) U.S. Cl.
CPC ........ *G03B 21/2053* (2013.01); *H01S 5/0085* (2013.01); *H04N 9/3126* (2013.01); *H04N 9/3161* (2013.01); *G02B 2027/0118* (2013.01)

(58) Field of Classification Search
CPC .... G02B 27/01; G02B 27/145; G03B 21/208; G03B 21/2033
See application file for complete search history.

(56) References Cited

U.S. PATENT DOCUMENTS

| | | | |
|---|---|---|---|
| 7,817,324 B2 | 10/2010 | Drumm | |
| 7,850,304 B2 * | 12/2010 | Jacobs | G02B 26/026 351/159.6 |
| 2002/0109900 A1 * | 8/2002 | Johnson | G02F 1/163 359/275 |
| 2003/0053188 A1 * | 3/2003 | Van Der Sluis | G02F 1/163 359/266 |
| 2004/0160657 A1 * | 8/2004 | Tonar | B60Q 1/2665 359/265 |
| 2005/0237595 A1 * | 10/2005 | Nakaho | B60R 1/088 359/265 |
| 2009/0086111 A1 * | 4/2009 | Inoue | H04N 9/3158 348/750 |
| 2009/0095962 A1 * | 4/2009 | Matsunobu | B23K 26/032 257/88 |
| 2010/0315597 A1 * | 12/2010 | Powell | G02B 26/08 353/20 |
| 2012/0013855 A1 * | 1/2012 | Lescure | G02B 26/101 353/81 |
| 2012/0050139 A1 * | 3/2012 | Wang | G02B 27/01 345/7 |
| 2012/0105812 A1 | 5/2012 | Dekker et al. | |

* cited by examiner

DEVICE AND METHOD FOR EMITTING A LIGHT BEAM INTENDED TO FORM AN IMAGE, PROJECTION SYSTEM, AND DISPLAY USING SAID DEVICE

The invention relates to a device and a method for emitting a light beam intended to form an image, a projection system using said device and a display using said system.

The invention will have applications, for example, in motor vehicles for informing the users of the vehicle, in particular its driver.

It is known to equip a motor vehicle with a so-called head up display system. Such a system is placed in the field of vision of the motor vehicle driver and displays information relating to the status of the motor vehicle, the traffic or other.

In order not to interfere with driving, it is necessary that the brightness of the projected image is adapted to the ambient brightness. In particular, it is necessary that the optical power of the projected image is greatly different during a daytime journey and a journey at night or when passing through a tunnel.

With head up displays using light emitting diodes, it has already been proposed to vary the brightness of the projected image by controlling the supply current of the diodes. Such devices allow a satisfactory adaptation of the brightness. However, their daytime brightness remains inadequate.

In order to compensate for this defect, displays are known which use light sources of the laser type. However, the adaptation of the brightness provided in such a case by controlling the amount of current supplying the sources does not make it possible to sufficiently reduce the optical power of the image. By way of example, if it is considered that it is desired to have an optical power of the order of 10000 Cd/m2 in daytime driving condition and of the order of 5 Cd/m2 in night driving conditions, it is observed that it is necessary to reduce the brightness by a factor of 2000 when changing from one of the driving conditions to the other.

Research conducted by the applicant on adapting the brightness of the projected image by controlling the current supply of the light sources, for example using pulse width modulation technologies or control of the amplitude of the current used, shows that these technologies have limits. It is notably necessary to have a minimum pulse duration and a minimum amplitude of the current for the linear operation of the diodes.

The purpose of the invention is to solve the above problems by proposing a device for emitting a light beam intended to from an image, said device comprising one or more sources, each emitting a beam of the laser type, said device being configured to form said light beam from the one laser beam or by bringing said laser beams together by combination. "Bringing together" means that, to the naked eye, said laser beams form, after combination, a single light beam even though they are still present individually in said beam. For the purpose of simplicity, the term "light beam" will continue being used hereafter to denote the combination of the laser beams after bringing them together.

According to the invention, said device comprises attenuation means, situated downstream of said source or sources, making it possible to vary the optical power of the light beam by transmitting and/or reflecting said beam or beams as a function of a supply current of said attenuation means. The term "optical power" means the light power of the light flux emitted by the source or sources. It can equally well be measured for example in milliwatts (mW), from the current generated by a photodiode receiving the light flux, or in candela per square meter (Cd/m2), or from the illumination produced by the light flux on a given area.

By attenuating the light beam emitted by the laser sources by specific means operating in a way other than by controlling their current supply, greater possibilities are available for reducing the optical power. Consequently, it is possible to simultaneously benefit from high daytime brightness and low brightness at night. Moreover, by using attenuation means operating on the basis of their power supply, a solution is employed which does not involve any mobile components.

According to one aspect of the invention, said attenuation means comprise one or more electrochromic mirrors. They will be able, for example, to be disposed in series in the path of said beam or beams. In this way, it is possible to combine their attenuation factor.

According to another aspect of the invention, which can be combined with the preceding one, said emission device can comprise means of control of the current supply of said sources, said control means being configured to provide additional adjustment of the optical power of said light beam. In this way the capabilities of adjustment of the optical power provided by the attenuation means and by the control means are combined in order to achieve the desired attenuation factor, in particular at least 1000, or even 2000.

Said control means can be configured to provide linear current regulation of the optical power of said laser beams in order to provide a choice of color of the light beam according to a proportion of optical power allocated to each of said laser beams. In this way a method of regulation dedicated to choice of color is available.

Said control means can also be configured to provide regulation by pulse width modulation of the optical power of said laser beams in order to achieve said additional adjustment of the optical power of said light beam. In this way a method of regulation dedicated to the additional adjustment of the optical power is available. In other words, the attenuation factor can result from the combined action of said attenuation means and a pulse width modulation of the supply current of said laser sources, said modulation being carried out using said control means.

More precisely, said control means are configured so that said pulse width modulation regulation provides said additional adjustment, for example, according to an attenuation factor of between 5 and 20, notably of 10. As for the attenuation means, these can make it possible to obtain an attenuation factor of between 100 and 300, notably of about 200, in particular by disposing several electrochromic mirrors in series, as mentioned above.

According to other features of the invention which can be taken together or separately, possibly combined with all at parts of the preceding features:
  said attenuation means are configured to vary the optical power of the at least one of said laser beams before its combination with at least one of said other laser beams, and/or said attenuation means are configured to vary the optical power of said light beam coming from the combination of said laser beams,
  said device furthermore comprises means of detecting ambient brightness and processing means making it possible to act on said attenuation means as a function of the ambient brightness detected by said detection means.

Advantageously, said emission device comprises at least three laser sources, each one of the three sources being capable of emitting a monochromatic light beam.

This being so, the invention also relates to an image projection system comprising a device for the emission of a light beam such as described above.

Said system comprises, for example, means for forming an image from said light beam. Said attenuation means can be situated upstream and/or downstream of said image forming means.

Said image forming means comprise, for example, a diffuser screen upon which is formed an image produced from the light source or sources of said emission device.

According to a first implementation, said image forming means furthermore comprise a laser scanning projector generating a light beam forming an image on the diffuser screen from the light beam generated by said emission device.

According to another embodiment, said image forming means comprise a projector comprising an array of micromirrors interposed between the light source or sources and the diffuser screen, the array of micromirrors forming a first projected image on the diffuser screen where a second projected mage is formed.

The invention also covers a head up display system comprising a projection system such as described above.

Such a system comprises, for example, a semi-reflecting plate, able to be disposed between the steering wheel and the windscreen of a vehicle, or the windscreen as such.

The system according to the invention can furthermore comprise a reflecting is device interposed in the path of the image between the diffuser screen and the semi-reflecting plate. Such a reflecting device makes it possible to install the projection device more easily whilst sending the image to the desired place from a given location of the emission device.

The invention also relates to a method for emitting a light beam intended for forming an image, in which method there is provided one or more sources, each one emitting a beam of the laser type, said light beam is formed from the one laser beam or by bringing together said laser beams by combination and the optical power of said light beam is varied using attenuation means situated downstream of said source or sources.

It will also be possible to provide additional adjustment of the optical power of said light beam using means for controlling the current supply of said source or sources, notably according the features already described above.

Advantageously, said method uses the emission device described above.

Figure 2:
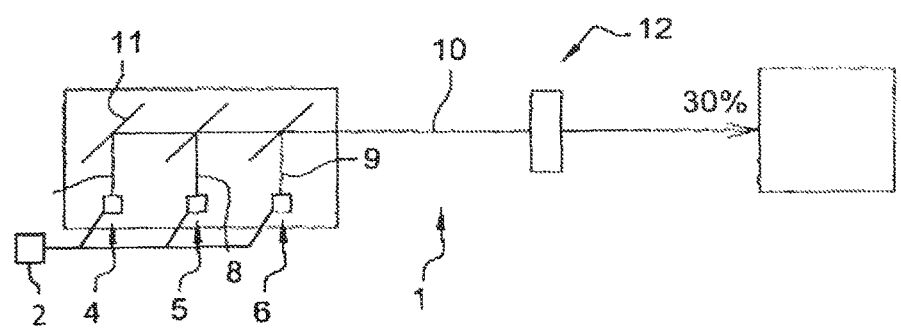
Figure 3:
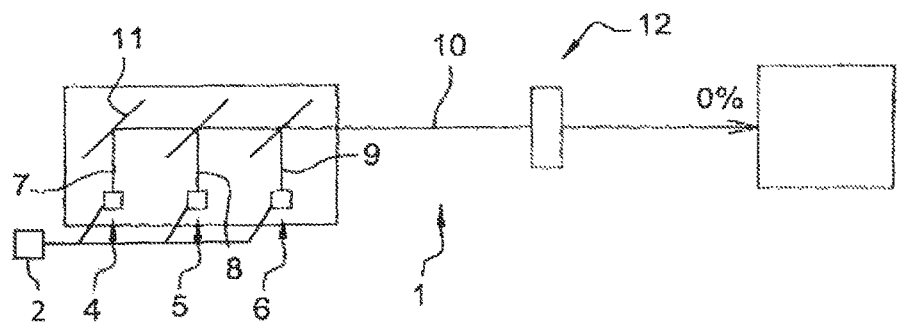
Figure 4:
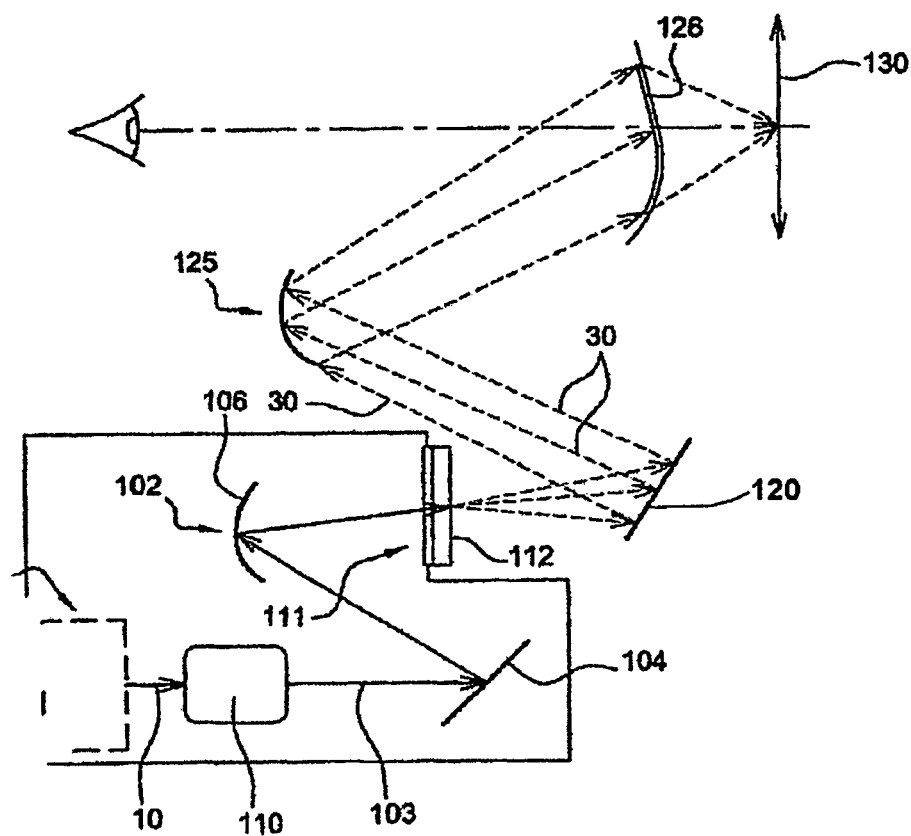

Other features, details and advantages of the invention will emerge more clearly on reading the description given hereafter as an indication and with reference to the drawings in which:

FIG. 1 is a diagrammatic view of an emission device according to the invention, in a first operating mode, FIG. 2 is a view of the device shown in FIG. 1 in a second operating mode, FIG. 3 is a view of the device shown in FIG. 1 in a third operating mode, FIG. 4 is a diagrammatic view of a head up display system according to the invention.

It should be noted that the figures disclose the invention in a detailed manner in order to use the invention, it being possible of course for said figures to be used for better defining the invention as necessary.

As shown in FIGS. 1 to 3, the invention firstly relates to a device 1 for emitting a light beam, intended to form an image. Such a device is more particularly intended to equip a head up display of a motor vehicle, where at least one item of information related to the vehicle is projected.

Said device comprises one or more sources 4, 5, 6 each emitting a beam 7, 8, 9 of the laser type. They are, for example, laser sources, typically laser diodes, each laser source emitting a monochromatic beam, that is to say consisting of a single color.

Said device here comprises a plurality of sources 4, 5, 6, three of them in this case, said device being configured to form the light beam 10 by bringing the beams 7, 8, 9 individually emitted by each of said sources 4, 5, 6 together in combination. More precisely, it will be possible for the sources to be ones emitting a different color from one source to another. The colors are, for example, red, green or blue (RGB).

The optical power of each of the sources is controlled independently, by using the supply current of the laser source or sources. At a given optical power, the color of the light beam 10 is determined by the way in which a power ratio is established between the different laser diodes. For example, in order to obtain white light, the optical powers, in proportion, must be established according to the following distribution: 60 for the green diode, 30 for the blue diode, 10 for the red diode. As described below, the optical power of each of the sources can also be controlled in order to modulate the optical power of the light beam 10.

The beams 7, 8, 9 emitted by each of the sources are oriented, for example, parallel with each other and reflect in the same direction in order to form said common light beam 10 by combination. To this end, said device 1 here comprises optical elements that are semi-transparent, over a range of wavelengths, such as dichroic mirrors or combining plates 11, intercepting the beams 7, 8, 9 emitted by each of said sources and combining them in the direction of said beam 10.

More generally, said device 1 is configured to form said light beam 10 from said laser beam or beams 7, 8, 9, however many sources 4, 5, 6 may be involved. In the case of a single source, the light beam 10 is composed of the laser beam emitted by the single source used and the image obtained will then be monochromatic, composed of the different optical powers applied to each of the points forming it, according to a gradation of said color. In the case of a plurality of sources, typically the three sources 4, 5, 6 mentioned above, said common beam 10 which then forms said light beam will allow the establishment of an image according to a color spectrum whose resolution will correspond to the fineness of control of the power supply of said sources 4, 5, 6.

According to the invention, said device 1 comprises attenuation means 12, situated downstream of said source or sources 4, 5, 6, making it possible to vary the optical power of the light beam 10 by transmitting and/or reflecting said beam or beams as a function of a supply current of said attenuation means 12. In other words, a color and/or an intensity being conferred on the light beam 10 by controlling the current supply of the sources, said attenuation means 12 make it possible to vary the optical power of the beam or beams 7, 8, 9, 10. In particular, it will be possible to adapt the optical power of the beam to daytime driving conditions and to night driving conditions.

Said device can comprise means of controlling the current supply of said sources. As mentioned above, they make it possible to choose the color of the light beam 10.

More precisely, said control means are configured, for example, to provide linear current regulation of the optical power of said laser beams 7, 8, 9 in order to provide said choice of color of the light beam 10, according to a proportion of optical power allocated to each of said laser beams 7, 8, 9. It is possible, for example, to provide an encoding of the color in six bits, corresponding to sixty four levels of optical power for each of said laser beams 7, 8, 9.

Said control means can also be configured to provide an additional adjustment of the optical power of said light beam. A particularly high attenuation rate can be achieved in this way.

More precisely, said control means are configured to provide regulation by pulse width modulation of the optical power of said laser beams 7, 8, 9 in such a way as to achieve said additional adjustment of the optical power of said light beam 10, notably according to an attenuation factor of between 5 and 20, in particular of about 10.

In this way it is possible to adjust the color and/or the optical power of said light beam 10. Said control means comprise, for example, a microcontroller 2.

Said attenuation means 12 comprise, for example one or more electrochromic mirrors. In a known manner, said mirrors reflect more or less light, depending on a current applied to them. Here a single mirror is illustrated but provision may be made for several, in particular disposed in series in the path of said beam or beams 7, 8, 9, 10.

Each mirror will be able to exhibit, for example, an attenuation factor of about 100. In this way it is possible to obtain, with two mirrors in series, an attenuation factor of about 200 which, combined with the attenuation factor coming from the control means, in particular from the pulse width modulation, makes it possible to reach the level of 2000 mentioned above.

In FIG. 1, said attenuation means 12 are supplied with a first level of current allowing about 100% reflection of the light beam 10. In FIG. 2, said attenuation means 12 are supplied with a second level of current allowing 30% reflection of the light beam 10. In FIG. 3, said attenuation means 12 cut off almost all the reflection of the light beam 10, as symbolized by the number 0%.

This being so, according to the configuration shown, said attenuation means 12 are placed in the path of the common light beam 10. In other words, said attenuation means 12 are configured to vary the optical power of said common light beam 10. More precisely, here, all or part of said electrochromic mirrors are placed in the path of the common light beam 10.

According to a variant which is not shown, said attenuation means 12 are placed at least partially in the path of the beams emitted by the sources 4, 5, 6, in this case between said sources 4, 5, 6 and said mirrors 11. In other words, said attenuation means 12 are configured to vary the optical power of the laser beam emitted by each of said sources 4, 5, 6. More precisely, all or part of said electrochromic mirrors are placed between said sources 4, 5, 6 and said mirrors 11.

Said device can furthermore comprise means of detection of ambient brightness and processing means making it possible to act on said attenuation means as a function of the ambient brightness measured by said detection means. Said means of detection of the ambient brightness comprise, for example, a light detector, such as the one modifying the display screens on the dashboard of a vehicle. Said processing means are integrated, for example, at the level of the microcontroller 2 mentioned above.

As shown in FIG. 4 the invention also relates to an image projection system 100 comprising an emission device 1 such as described above. The projection system projection 100 furthermore comprises means 102 of forming an image from said light beam 10.

Said image forming means 102 comprise, for example, a scanning generator 110 whose function is to move the light beam 10 horizontally and vertically for the purpose of producing scanning at a frequency, notably equal to 60 Hz, as a non-limiting example. The scanning generator 110 notably comprises a scanning mirror having a micro-electro-mechanical system (hereafter called MEMS) upon which the light beam 10 is reflected as a scanning beam 103. Such a MEMS mirror has for example a diameter of 1 mm. The MEMS mirror is able to rotate about two axes of rotation in order to produce a scanning, for example at a the refresh frequency of 60 Hz, of a diffuser screen 111 of said image forming means 102. Said image is formed on said diffuser 111. Alternatively, the MEMS mirror can be replaced by two movable flat mirrors, the movements of which are coupled. One of these mirrors can be dedicated to scanning along a horizontal axis whilst the other mirror can be dedicated to scanning along a vertical axis.

The diffuser 111 where the image is formed can be a transparent projection screen having a complex structure for projection by transparency. Alternatively, it can be translucent. It is made, for example, from glass, notably frosted, or from polycarbonate. By way of example, the diffuser screen is of the exit pupil (Exit Pupil Expander) type. It makes it possible to have a widened observation cone. It extends in a plane traversed by the light beam, the image resulting from this scanning beam 103 being formed in the plane of a face of the diffuser screen 111.

This diffuser screen receives the scanning beam 103. It is arranged to cause dispersion of this scanning beam 103 in an angular sector, for example, equal to 30° with respect to the direction of the scanning beam 103 at the moment it strikes the diffuser screen 111. In order to do this, according to a non-limiting example, a face 112 of the diffuser screen is rough, in the sense that it comprises asperities which cause the dispersion of the scanning beam 103. The rough face 112 corresponds to the one though which the beam exits, that is to say the face upon which the image is formed.

According to another variant which is not shown, said image forming means do not comprise a scanning generator, such as previously described, but a micromirror array (also called digital micromirror system). In this configuration the image is formed at the level of the micromirror array and then projected onto the diffuser screen. In general, projection optics are placed between the array and the screen. Each micromirror corresponds to a pixel of the image. In this embodiment, the image is not formed for the first time on the diffuser screen but an image previously formed on the micromirror array is received.

It should be noted that said attenuation means 12 can be, as in the example shown, upstream of said image forming means 102. They can also be downstream. In a variant, they can be placed between the scanning generator 110 or the micromirror array, on the one hand, and the diffuser screen 111 on the other hand.

Said projection system can furthermore comprise various mirrors 104, 106, notably in the path of the scanning beam 103.

The invention also relates to a display, notably a head up display, comprising a projection system 100 according to any one of the variants described above.

Downstream of the diffuser screen 111 in the direction of movement of the light beam, said display comprises at least a semi-reflective plate 126 and a reflecting device 125 interposed in the path of the image between the diffuser screen 111 and the semi-reflective plate 126. In this figure, the path of the image is symbolized by three arrows 30 shown in dotted line which reflect on the reflection device 125 before being displayed through the semi-reflective plate 126. The latter allows an enlargement and/or, by transparency, a display of the image beyond said semi-reflective plate, notably beyond the windscreen of the equipped vehicle, at the level of a virtual screen 130, obtained with the help of said semi-reflective plate 126. In one or more embodiments, mirror 120 is disposed in the optical path of the image between diffuser screen 111 and reflecting device 125. In one or more embodiments, mirror 120 may be replaced by a plurality of mirrors. In one or more embodiments, one or more of mirror 120, the aforementioned plurality of mirrors and reflecting device 125 may by electrochromic mirrors. The aforementioned plurality of mirrors may be disposed in series along the optical path of the image.

This transparent plate has a reflection power at least equal to 20%, which allows the user to see the route taken by the vehicle through the plate, whilst benefiting from a high contrast making it possible to see the displayed image. Alternatively, the display of the image can take place on the windscreen of the vehicle equipped with said display.

As already stated, said attenuation means can be situated downstream of the image forming device 102 and as far as the semi-reflective plate 126.

The invention claimed is:

1. A device for emitting a combined light beam intended to form an image, said device comprising:
   one or more laser sources, each emitting a laser beam, said device forming said combined light beam by combining said laser beams from the one or more laser sources;
   an attenuation means situated downstream of said one or more laser sources, said attenuation means allows varying of an optical power as a function of a supply current of said attenuation means;
   a control means for controlling the current supply of said laser sources, wherein said control means provides additional adjustment of the optical power of said combined light beam,
   wherein said control means provide linear current regulation of the optical power of said laser beams to provide a choice of color of the combined light beam according to a proportion of optical power allocated to each of said laser beams.

2. The device as claimed in claim 1, in which said attenuation means comprise one or more electrochromic mirrors.

3. The device as claimed in claim 2, in which said electrochromic mirrors are disposed in series over the path of said combined light beam or said laser beams.

4. The device as claimed in claim 1, in which said control means provide regulation by pulse width modulation of the optical power of said laser beams to achieve said additional adjustment of the optical power of said combined light beam.

5. The device as claimed in claim 4, in which said control means provide said regulation by pulse width modulation that provides said additional adjustment according to an attenuation factor of between 5 and 20.

6. The device as claimed in claim 1, in which said attenuation means vary the optical power of at least one of said laser beams before combination with at least one of said other laser beams.

7. The device as claimed in claim 1, in which said attenuation means vary the optical power of said combined light beam coming from the combination of said laser beams.

8. An image projection system comprising the device as claimed in claim 1.

9. The system as claimed in claim 8, comprising means for forming the image from said light combined beam and wherein said attenuation means are situated downstream of said image forming means.

10. A head up display, comprising at least the projection system as claimed in claim 8.

11. A device for emitting a combined light beam intended to form an image, said device comprising:
    one or more laser sources, each emitting a laser beam, said device forming said combined light beam by combining said laser beams from the one or more laser sources;
    an attenuation means situated downstream of said one or more laser sources, said attenuation means allows varying of an optical power as a function of a supply current of said attenuation means;
    a control means for controlling the current supply of said laser sources, wherein said control means provides additional adjustment of the optical power of said combined light beam; and
    means of detecting ambient brightness and processing means for acting on said attenuation means as a function of the ambient brightness measured by said detection means.

12. A method for emitting a combined light beam intended for forming an image, in which method there is provided one or more laser sources, each one emitting a laser beam, said combined light beam being formed from the one or more laser beams by combination, the method comprising:
    varying an optical power of said combined light beam using attenuation means situated downstream of said one or more laser sources,
    wherein said attenuation means allows varying of the optical power of said combined light beam by transmitting or reflecting said combined light beam or said laser beams as a function of a supply current of said attenuation means; and
    controlling the current supply of said laser sources by a control means, said control means providing additional adjustment of the optical power of said combined light beam,
    wherein said control means provide linear current regulation of the optical power of said laser beams to provide a choice of color of the combined light beam according to a proportion of optical power allocated to each of said laser beams.

13. The method as claimed in claim 12, in which additional adjustment of the optical power of said combined light beam is provided using means for controlling the current supply of said one or more laser sources.

* * * * *